US006819156B1

(12) United States Patent
Nix

(10) Patent No.: US 6,819,156 B1
(45) Date of Patent: Nov. 16, 2004

(54) HIGH-SPEED DIFFERENTIAL FLIP-FLOP

(75) Inventor: Michael A. Nix, Buda, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/994,233

(22) Filed: Nov. 26, 2001

(51) Int. Cl.$^7$ .............................................. H03K 3/356
(52) U.S. Cl. ..................... 327/203; 327/208; 327/211; 327/218
(58) Field of Search ................................ 327/199–203, 327/208, 211–215, 218, 219, 55, 57, 115, 117, 210; 326/93, 95–98; 377/47, 104, 114, 117, 126; 365/205

(56) References Cited

U.S. PATENT DOCUMENTS

| | | | | |
|---|---|---|---|---|
| 5,036,217 A | * | 7/1991 | Rollins et al. .............. | 327/203 |
| 5,384,493 A | * | 1/1995 | Furuki ......................... | 327/203 |
| 5,777,491 A | * | 7/1998 | Hwang et al. .............. | 326/113 |
| 6,002,270 A | * | 12/1999 | Timoc .......................... | 327/57 |
| 6,337,583 B1 | * | 1/2002 | Ooishi et al. ............... | 326/119 |
| 6,373,292 B1 | * | 4/2002 | Choe ........................... | 326/121 |
| 6,433,586 B2 | * | 8/2002 | Ooishi ......................... | 326/93 |
| 2003/0052720 A1 | * | 3/2003 | Tung et al. ................. | 327/218 |

FOREIGN PATENT DOCUMENTS

JP 2000244287 * 9/2000

* cited by examiner

*Primary Examiner*—Long Nguyen
(74) *Attorney, Agent, or Firm*—Arthur Joseph Behiel; Kim Kanzaki

(57) ABSTRACT

Described are high-speed differential flip-flops. A flip-flop in accordance with one embodiment incorporates some combinational logic, eliminating the need for separate combinational logic when the flip-flop is employed in certain circuit configurations. A flip-flop in accordance with another embodiment includes differential input and output stages, each of which includes a transistor connected across its differential output terminals. The transistors are clocked to short the differential output terminals between expressions of logic levels, thereby limiting the maximum amount of voltage swing required to express subsequent logic levels.

14 Claims, 4 Drawing Sheets

HIGH-SPEED DIFFERENTIAL FLIP-FLOP

BACKGROUND

Logic circuits can be classified into two broad categories, combinational logic circuits and sequential logic circuits. The basic building block of sequential logic circuits is the flip-flop, also called a bi-stable multi-vibrator or latch. In most cases, logic circuits employ both sequential and combinational logic.

FIG. 1 (prior art) depicts an exemplary logic circuit 100 that includes both combinational and sequential logic elements. Logic circuit 100 is a divide-by-five counter 100 with a pair of NOR gates 105 in a feedback path of a series of differential-input flip-flops 110. Circuit 100 receives a pair of complementary clock signals C and Cb, which extend to clock input terminals of each of the flip-flops 110. Circuit 100 produces a pair of complementary clock signals C/5 and Cb/5 with a frequency one fifth that of the input clock signals. The differential nature of circuit 100 allows for higher clock frequencies than would a similar divide-by-five circuit using single-ended sequential logic elements.

FIG. 2 (prior art) depicts an embodiment of a differential-input flip-flop 110 for use in circuit 100 of FIG. 1. The operation of flip-flop 110 is commonly understood by those of skill in the art, so a detailed description of flip-flop 110 is omitted here for brevity.

If manufactured using commonly available CMOS processes, flip-flop 110 can perform with clock frequencies as high as about 2 GHz. Unfortunately, modern high-speed digital communication systems employ clock and data recovery circuits operating in the 10 Gb/s range. The frequency response of flip-flop 110 is therefore insufficient to meet the needs of some modern systems.

SUMMARY

The present invention is directed to high-speed flip-flops. A flip-flop in accordance with one embodiment of the invention has a differential input stage that incorporates some combinational logic. This embodiment improves speed performance by reducing or eliminating the need for separate combinational logic circuits when the flip-flop is employed in certain circuit configurations. In one example, a flip-flop incorporating combinational logic is used in conjunction with other flip-flops to create a counter circuit that would otherwise require separate combinational logic.

A flip-flop in accordance with another embodiment of the invention includes differential input and output stages, each of which includes a transistor connected across its differential output terminals. The transistors are clocked to short the differential output terminals between expressions of logic levels, thereby limiting the maximum amount of voltage swing required to express subsequent logic levels.

This summary does not define the scope of the invention, which is instead defined by the appended claims.

A BRIEF DESCRIPTION OF THE FIGURES

Figure 3:
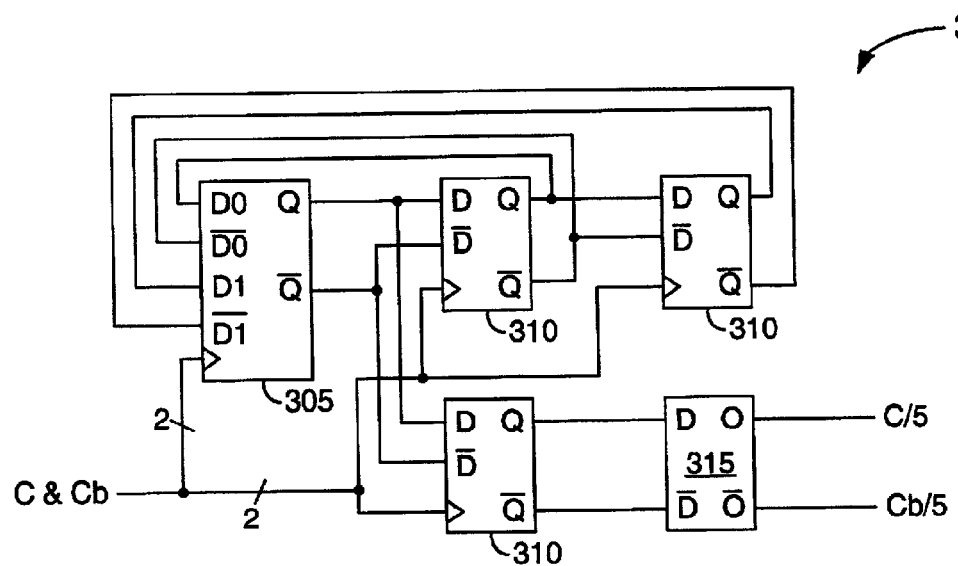
FIG. 3 depicts a divide-by-five circuit 300 that divides a pair of complimentary clock signals C and Cb by five.
Figure 7:
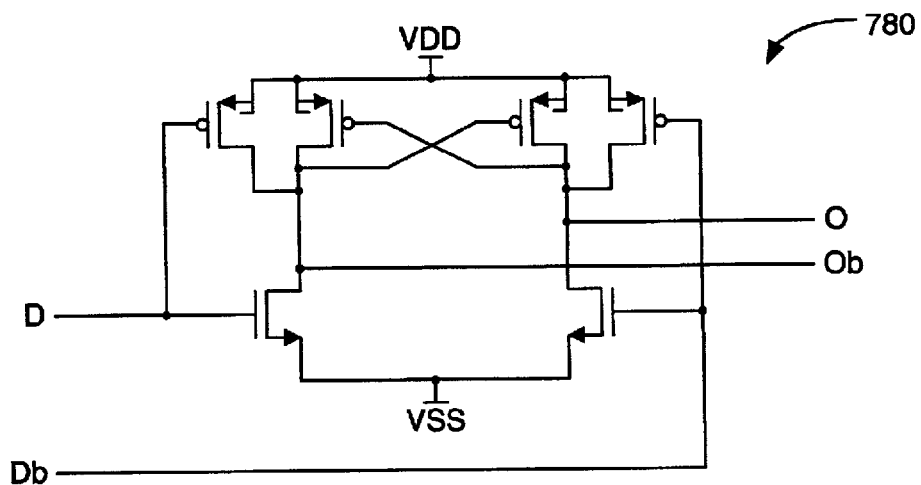

FIG. 7 depicts a differential circuit that can be used as circuit 315 of FIG. 3 to convert the differential signal on terminals Q and Qb of the last flip-flop 310 in circuit 300 into full-swing, stable differential output signals.

DETAILED DESCRIPTION

Figure 1:
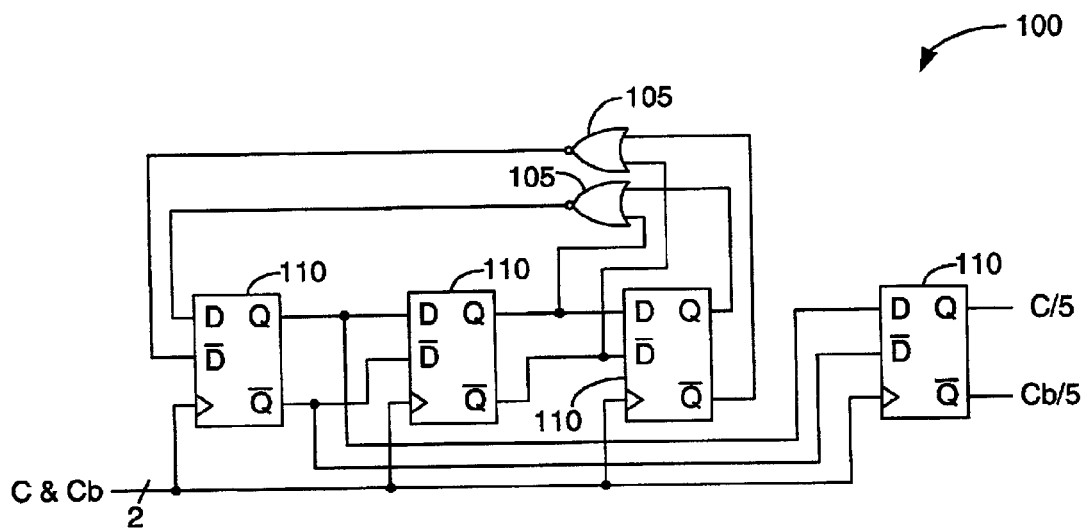
FIG. 1 (prior art) depicts an exemplary logic circuit 100 that includes both combinational and sequential logic elements.

FIG. 3 depicts a divide-by-five circuit 300 that divides a pair of complimentary clock signals C and Cb by five. Like circuit 100 of FIG. 1, circuit 300 employs differential signaling to improve performance. Circuit 300 differs from circuit 100, however, in that the logic associated with NOR gates 105 of FIG. 1 is incorporated into a single flip-flop 305 adapted to receive two pairs of complimentary inputs D0, D0b and D1, D1b. The operation of an embodiment of flip-flop 305 is detailed below in connection with FIG. 6.

Circuit 300 also includes a number of flip-flops 310 that are modified in accordance with the invention to improve speed performance. Finally, circuit 300 includes a differential to single-ended converter 315. Flip-flops 310 and converter 315 are described below in connection with FIGS. 4, 5, and 7.

Figure 4:
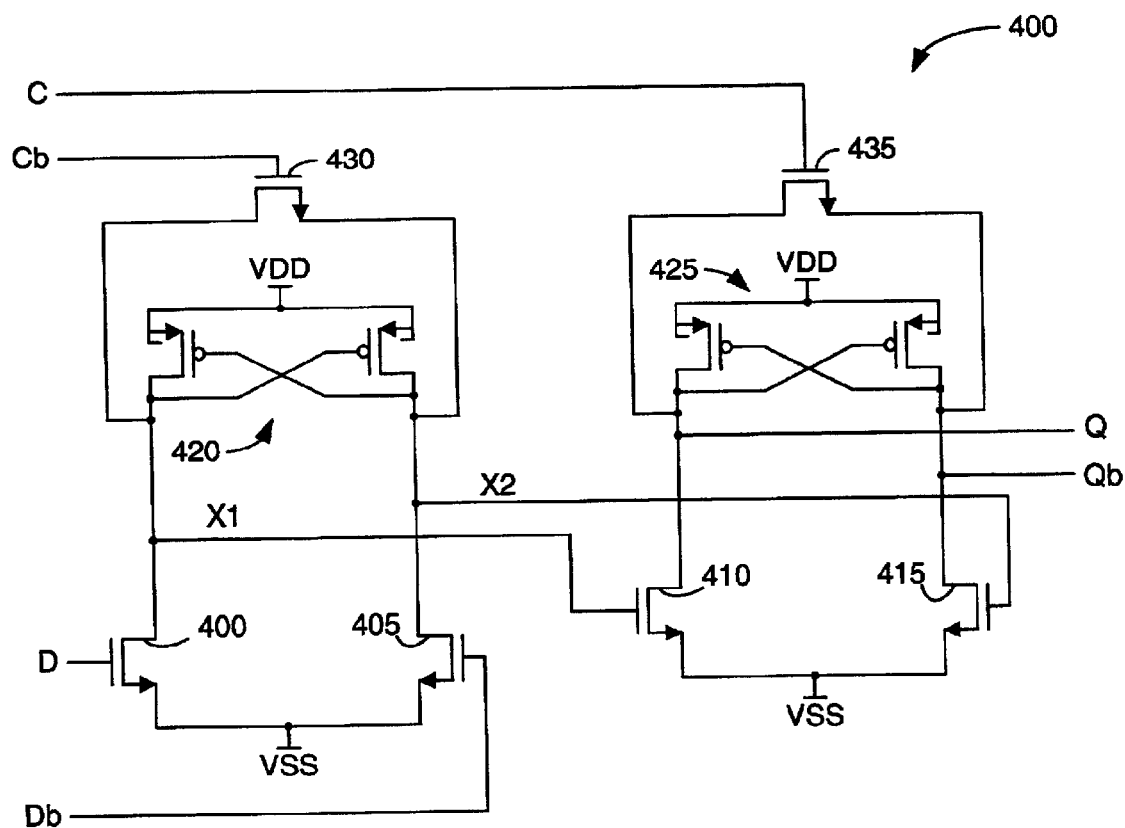
FIG. 4 depicts a flip-flop 400 that is an embodiment of flip-flop 310 of FIG. 3.

FIG. 4 depicts a flip-flop 400 that is an embodiment of flip-flop 310 of FIG. 3. Flip-flop 400 includes an input stage (left) and an output stage (right). The input stage includes a pair of differential transistors 400 and 405, the control inputs of which are connected to respective complementary data inputs D and Db. The output terminals X1 and X2 of the input stage connect to respective control terminals of a pair of differential transistors 410 and 415 in the output stage. The input and output stages include respective cross-coupled PMOS transistor loads 420 and 425.

The input stage includes an NMOS transistor 430 X having one current handling terminal connected to output terminal X1 and the other connected to output terminal X2. The control input (gate) of transistor 430 is connected to the clock signal Cb. The output stage likewise includes a transistor 435, one current-handling terminal of which is connected to output terminal Q, the other current-handling terminal to output terminal Qb. The control terminal of transistor 435 is connected to clock signal C. In another embodiment, one of transistors 430 and 435 is substituted with a PMOS transistor, allowing both control terminals associated with transistors 430 and 435 to be controlled by the same clock signal.

Figure 5:
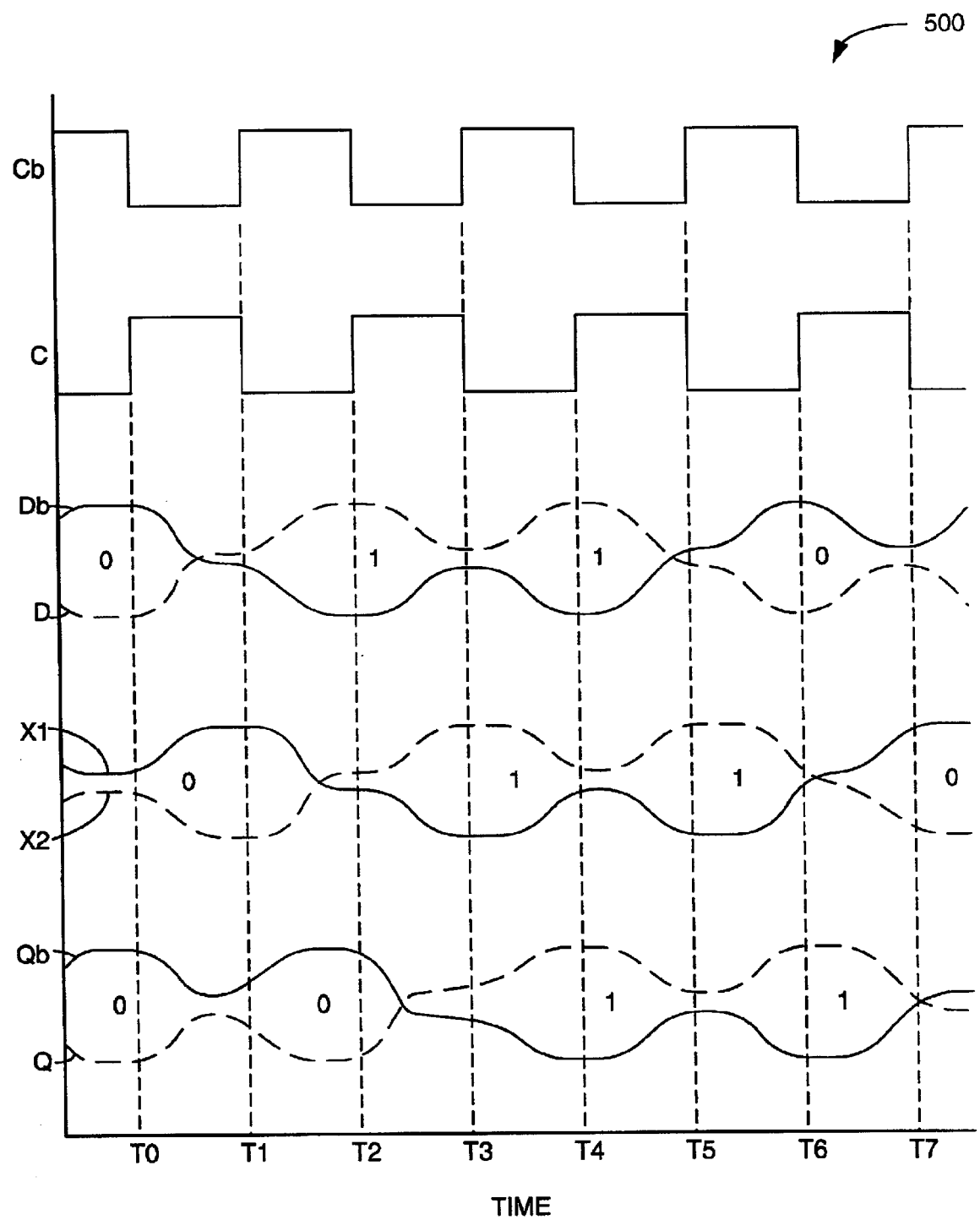
FIG. 5 is a waveform diagram 500 depicting exemplary signals associated with the operation of flip-flop 400 of FIG. 4.

FIG. 5 is a waveform diagram 500 depicting exemplary signals associated with the operation of flip-flop 400 of FIG. 4. Diagram 500 depicts complimentary clock signals C and Cb, data signals D and Db, input-stage output signals X1 and X2, and output terminals Q and Qb. The various node labels refer to both the signal and the corresponding circuit node. Whether a given designation refers to a node or a signal will be clear from the context.

Prior to time T0, clock signal Cb is high, so transistor 430 connects output terminals X1 and X2 of the input stage of flip-flop 400. The logic 0 input on the differential terminals D and Db consequently produces only a relatively small voltage difference across terminals X1 and X2. Though limited by the on resistance of transistor 430, the voltage across terminals X1 and X2 does reflect a logic 0 (i.e., X1>X2).

At time T0, clock signal Cb goes low, turning off transistor 430 to disconnect terminals X1 and X2. The voltage between terminals X1 and X2 thus increases, better representing the difference between input signals on terminals D and Db. Also at time T0, clock signal C goes high, causing transistor 435 to connect output terminals Q and Qb. The voltage difference between signals Q and Qb therefore diminishes. Though limited by the on resistance of transistor 435, the voltage across terminals Q and Qb continues to reflect a logic 0 (i.e., Q<Qb).

Next, at time T1, clock signal C returns low and complimentary clock signal Cb returns high. Respective transistors 430 and 435 consequently change states, so that terminals X1 and X2 are once again connected and terminals Q and Qb are disconnected. In this new state, terminals X1 and X2 begin to approach one another and output terminals Q and Qb swing away from one another to reflect the differential input signals to transistors 410 and 415.

Before the receipt of a new data bit on differential input terminals D and Db, the pairs of output terminals X1,X2 and Q,Qb approach one another to limit the maximum amount of voltage swing required to move the differential output signal to the next logic bit. For example, the logic level expressed on output terminals Q and Qb from time T2 to time T4 switches from a logic 0 to a logic 1, and therefore requires a maximum voltage swing for each of output terminals Q and Qb. The present invention expedites the time required to make this transition by beginning to bring Qb low and Q high prior to receipt of the data signal indicating the logic transition. The resulting reduction in the maximum voltage swing required to change the logic level expressed on terminals Q and Qb reduces the maximum amount of time required to make logic transitions on terminals Q and Qb. This embodiment of the invention thus speeds the logic transitions on the outputs of flip-flop 310.

As illustrated between times T4 and T6, the voltage difference between terminals Q and Qb is reduced even if the next data bit turns out to be the same logic level as the one presently represented. This is because flip-flop 400 cannot anticipate the next logic level, and consequently must prepare for either of the two alternatives. Flip-flop 400 therefore requires some amount of time to "transition" between two logic zeroes or two logic ones. The overall speed of flip-flop 400 increases because the time required to transition between different logic levels is reduced.

Figure 2:
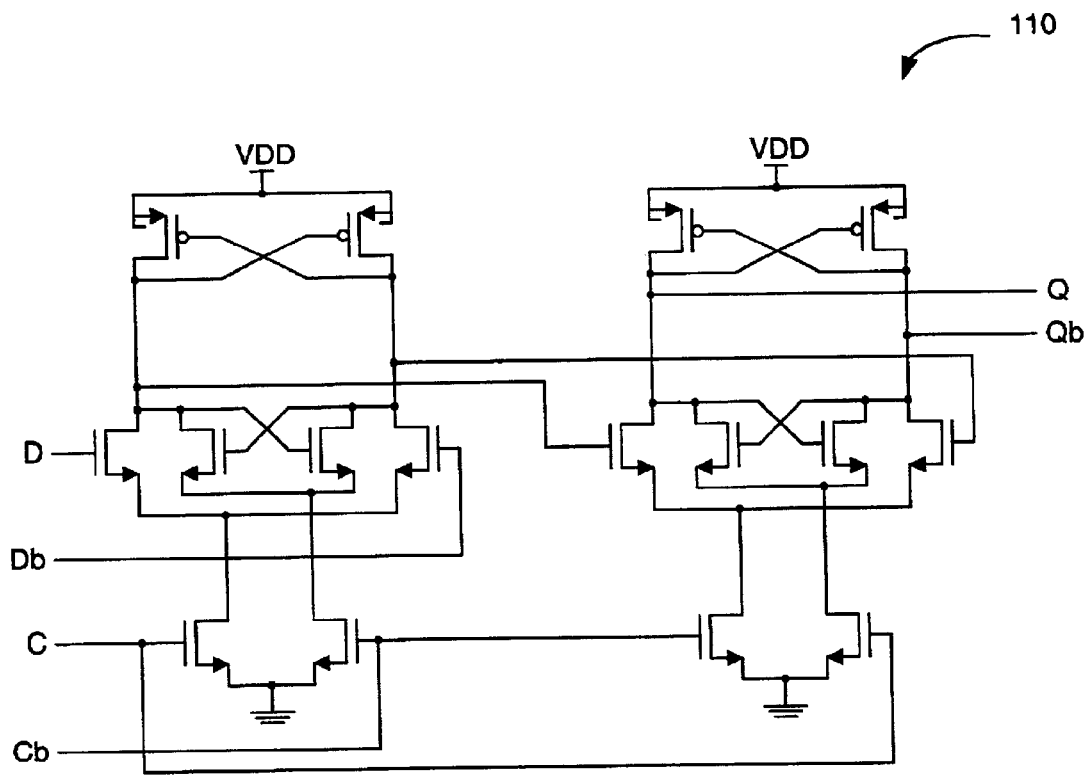
FIG. 2 (prior art) depicts an embodiment of a differential-input flip-flop 110 for use in circuit 100 of FIG. 1.

Reducing the time required for flip-flop 400 to transition between different logic levels translates directly into improved speed performance. Moreover, as compared with flip-flop 110 (FIG. 2), flip-flop 400 has far fewer transistors, and can therefore be implemented using less die area. These changes also result in significantly reduced power consumption for a given level of speed performance.

Figure 6:
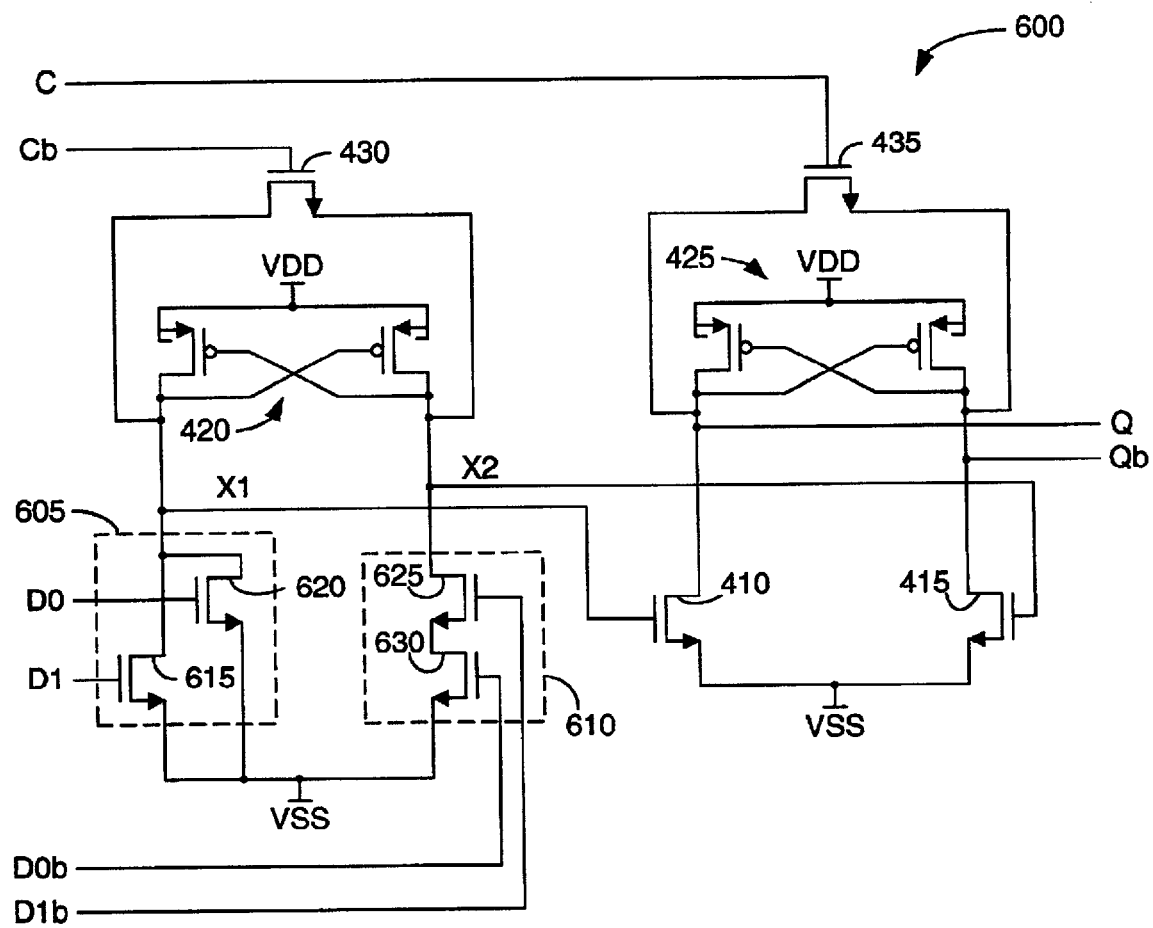
FIG. 6 depicts a flip-flop 600 that may be used in place of flip-flop 305 (FIG. 3) in one embodiment of the invention.

FIG. 6 depicts a flip-flop 600 that may be used in place of flip-flop 305 (FIG. 3) in one embodiment of the invention. Flip-flop 600 is largely similar to flip-flop 310 of FIG. 4, like numbered features being identical. Due to the similarities of flip-flop 600 and flip-flop 310, a detailed description of flip-flop 600 is omitted for brevity.

Flip-flop 600 is modified in accordance with an embodiment of the invention to receive two pairs of differential inputs D0,D0b and D1,D1b. As noted above in connection with FIG. 1, NOR gates 105 impose some delay that slows the maximum operating speed of circuit 100 of FIG. 1. Flip-flop 600 incorporates a pair of logic gates 605 and 610 that eliminate the need for NOR gates 105, and therefore speed up divide-by-five circuit 300 of FIG. 3. Gate 605, composed of a pair of transistors 615 and 620, performs a NOR function of inputs D0 and D1; a pair of serial-connected transistors 625 and 630 within gate 610 performs a NAND function of input signals D0b and D1b.

As shown in FIG. 5, the data output on complimentary output terminals Q and Qb fluctuates even when the data signal does not. FIG. 7 depicts a differential circuit that can be used as circuit 315 of FIG. 3 to convert the differential signal on terminals Q and Qb of the last flip-flop 310 in circuit 300 into full-swing, stable differential output signals.

While the present invention has been described in connection with specific embodiments, variations of these embodiments will be obvious to those of ordinary skill in the art. For example, the invention can be adapted for use with other types of sequential logic elements, such as single-stage latches, toggle flip-flops, a J-K flip-flops, AND-input flip-flops, or XOR-input flip-flops. Moreover, some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A flip-flop comprising:
   a. a differential output stage having differential first and second input terminals and complementary first and second output terminals;
   b. a transistor having a first current-handling terminal connected to the first output terminal, a second current-handling terminal connected to the second output terminal, and a control terminal;
   c. wherein the differential output stage includes a cross coupled circuit having a cross coupled transistor configured to continuously receive power from a positive power supply voltage, wherein a gate of the cross coupled transistor is connected to the second output terminal;
   d. a differential input stage having differential third and fourth input terminals and complementary third and fourth output terminals connected to the first and second input terminals, respectively; and
   wherein the differential input stage includes another transistor having a current-handling terminal continuously connected to VSS and a gate connected to the third input terminal, and another cross coupled circuit including another cross coupled transistor having a gate connected to the fourth output terminal.

2. The flip-flop of claim 1, further comprising a clock terminal connected to the control terminal.

3. The flip-flop of claim 1, further comprising a second transistor having a third current-handling terminal connected to the first input terminal, a fourth current-handling terminal connected to the second input terminal, and a second control terminal.

4. The flip-flop of claim 3, further comprising a first clock terminal connected to the first-mentioned control terminal and a second clock terminal connected to the second control terminal.

5. The flip-flop of claim 4, wherein the first and second clock terminals are adapted to receive complementary clock signals.

6. A flip-flop comprising a differential input stage having differential first and second input terminals, differential third and fourth input terminals, a first transistor, and complementary first and second output terminals, wherein the first transistor has a first control terminal connected to the first input terminal and a current handling terminal directly connected to VSS, and further comprising another transistor having a first current-handling terminal connected to the first output terminal, a second current-handling terminal connected to the second output terminal, and a control terminal receiving a clock signal and further comprising a cross coupled circuit having a cross coupled transistor directly connected to a positive power supply voltage, wherein a gate of the cross coupled transistor is connected to the second output terminal.

7. The flip-flop of claim 6, wherein the input stage further comprises a first leg including the first transistor and a second transistor connected in parallel, the second transistor having a second control terminal connected to the third input terminal.

8. The flip-flop of claim 7, wherein the input stage further comprises a second leg including third and fourth transistors connected in series, the third transistor having a third control signal connected to the second input terminal and the fourth transistor having a fourth control terminal connected to the fourth input terminal.

9. The flip-flop of claim 6, further comprising an output stage having:
   a. differential fifth and sixth input terminals connected to respective ones of the first and second output terminals;
   b. complementary third and fourth output terminals; and
   c. a transistor having a first current-handling terminal connected to the third output terminal, a second current-handling terminal connected to the fourth output terminal, and a second control terminal.

10. The flip-flop of claim 9, further comprising a clock terminal connected to the second control terminal.

11. A counter circuit comprising:
   a. a first flip-flop having:
      i. a differential output stage having differential first and second input terminals and complementary first and second output terminals; and
      ii. a first transistor having a first current-handling terminal connected to the first output terminal, a second current-handling terminal connected to the second output terminal, and a first control terminal; and
      iii. a cross coupled circuit having a cross coupled transistor directly connected to a positive power supply voltage, wherein a gate of the cross coupled transistor is connected to the second output terminal; and
   b. a second flip-flop having:
      i. a differential input stage having differential third and fourth input terminals connected to the respective first and second output terminals of the first flip-flop, a second transistor, and complementary third and fourth output terminals, the second transistor having a gate connected to the third input terminal and a current handling terminal directly connected to VSS; and
      ii. a third transistor having a third current-handling terminal connected to the third output terminal, a fourth current-handling terminal connected to the fourth output terminal, and a second control terminal.

12. The counter of claim 11, wherein the first and second control terminals are adapted to receive complementary clock signals.

13. The counter of claim 11, the first flip-flop further comprising a second differential input stage having differential fifth and sixth input terminals and complementary fifth and sixth output terminals, wherein the fifth and sixth output terminals are connected to the first and second input terminals, respectively.

14. The counter of claim 11, the second flip-flop further comprising a second differential output stage having differential fifth and sixth input terminals connected to the third and fourth output terminals, respectively.

* * * * *